INVENTORS
JEAN-CLAUDE FROUIN
MICHEL DE BREBISSON

BY Frank R. Jirfani
AGENT

METHOD OF MANUFACTURING AN INTEGRATED SEMICONDUCTOR DEVICE

INVENTORS
JEAN-CLAUDE FROUIN
MICHEL DE BREBISSON

BY Frank R. Trifari
AGENT

METHOD OF MANUFACTURING AN INTEGRATED SEMICONDUCTOR DEVICE

INVENTORS
JEAN-CLAUDE FROUIN
MICHEL DE BREBISSON

BY Frank R. Jinfani
AGENT

METHOD OF MANUFACTURING AN INTEGRATED SEMICONDUCTOR DEVICE

Filed Feb. 5, 1968 5 Sheets-Sheet 4

INVENTORS
JEAN-CLAUDE FROUIN
MICHEL DE BREBISSON

BY Frank R. Trifari
AGENT

INVENTORS
JEAN-CLAUDE FROUIN
MICHEL DE BREBISSON
BY Frank R. Trifari
AGENT

United States Patent Office 3,562,032

Patented Feb. 9, 1971

3,562,032
METHOD OF MANUFACTURING AN INTEGRATED SEMICONDUCTOR DEVICE

Jean-Claude Frouin and Michel de Brebisson, Caen, France, assignors, by mesne assignments, to U.S. Philips Corporation, New York, N.Y., a corporation of Delaware Filed Feb. 5, 1968, Ser. No. 703,043
Claims priority, application France, Feb. 7, 1967, 93,984
Int. Cl. H01l 7/44, 7/64
U.S. Cl. 148—175 5 Claims

ABSTRACT OF THE DISCLOSURE

A method for making a monolithic integrated circuit is described. The circuit includes vertical complementary transistors in isolated islands. The emitter of the PNP transistor is diffused simultaneously with the isolation walls defining the islands. The base of the PNP transistor is formed by the island region adjacent the substrate, which acts as a collector. The NPN transistor is the usual double-diffused transistor.

Figure 1A:
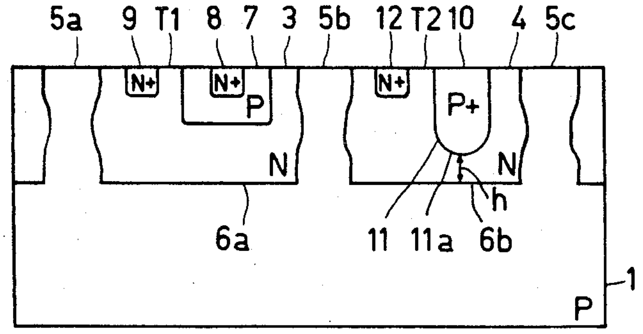

The invention relates to a method of manufacturing an integrated semiconductor device in which an epitaxial semiconductor layer of one conductivity taype is provided on a semiconductor substrate of the opposite conductivity type and the epitaxial layer is divided in islands of one conductivity type by providing isolation regions of the opposite conductivity type by diffusion from the sides of the epitaxial layer located opposite to each other, and a first transistor having a diffused base and emitter region is formed in at least one island and the collector region of which is formed by the island itself.

The insulation between the islands is ensured by the junctions between the islands and the substrate with the isolation regions, which junctions can be biased in a suitable manner.

In manufacturing integrated semiconductor devices, it is easy to obtain transistor structures which are either of the npn-type of the pnp-type by various known methods. The most commonly used method consists in performing two successive diffusions in an island to obtain the base and the emitter of the transistor, while the island itself constitutes the collector of the transistor; a transistor thus manufactured is termed a transistor having a diffused base and emitter.

In manufacturing monolithic integrated semiconductor devices on the contrary having simultaneously one or more pnp-transistors and one or more npn-transistors great difficulties are encountered.

It is to be noted that pnp-transistors and npn-transistors with respect to each other are termed transistors of the complementary type.

According to a known method, a first transistor having a diffused emitter and base is provided in a conventional manner in one island, while in another island a second transistor of the complementary type is provided having a diffused emitter which is located beside a diffused collector. The diffused emitter and collector of the second (lateral) transistor are usually provided simultaneously with the diffused base of the first transistor. The gain of such a second transistor often is very bad.

A second (vertical) complementary transistor can also be obtained by providing the emitter of the second transistor simultaneously with the base of the first transistor in another island, the island itself constituting the base of the second transistor and the substrate constituting the collector. This second transistor is of the same type and thus has the same gain as the stray (parasitic) transistor which is associated with the first transistor. The emitter, the base and the collector of said stray transistor are formed by the base and the collector of the first transistor and by the substrate, respectively. Usually it is desirable that the stray transistor has a very low gain, but in that case the second transistor also shows a very low gain which often is a drawback.

It is the object of the invention to provide a simple method without extra process steps in which the said drawbacks can be decreased considerably.

The invention is based on the recognition of the fact that the said drawbacks can be avoided by providing the emitter of the second transistor simultaneously with the isolation regions.

According to the invention, a method of the type mentioned in the preamble is characterized in that at least one second transistor is formed in another island which transistor is of a type complementary to that of the first transistor and the emitter region of which is provided by diffusion simultaneously with the isolation region and the island of which itself constitutes the base region and the substrate constitutes the collector region, after which the base and the emitter of the first transistor are formed likewise by diffusion.

The invention has numerous advantages. The invention enables a high gain for the said second transistor associated with the said first transistor having diffused base and emitter to be obtained. In particular, this gain may be approximately 40 times higher than the grain of a lateral transistor having a diffused emitter and collector already mentioned above, which is obtained in the manner described together with a transistor having a diffused base and emitter. A further important advantage is that the emitter of the second transistor can be diffused much deeper according to a method of the invention then the base region of the first transistor.

In addition the present invention can be readily carried into effect, in which the method of manufacturing to be described below is compatible with the planar method.

A preferred embodiment of a method according to the invention is characterized in that first deposits which are strongly doped and are of the same conductivity type as the substrate are provided on a surface of the latter which is then coated with the epitaxial layer, second deposits of the same type as the first and corresponding therewith being then provided simultaneously on the free surface of the epitaxial layer, the first and second deposits serving to obtain the isolation regions, and at least one local deposit, preferably of the same material as that of the said first and second deposits which is destined to constitute the emitter of the second transistor, after which the substrate, the epitaxial layer and the deposits are brought to the diffusion temperature of said deposits. The deposits are preferably obtained by prediffusion at high temperature.

Of course, the present invention is not restricted to an integrated semiconductor device having only two transistors. It relates in particular to a method of manufacturing an integrated semiconductor device in which a further transistor is provided and which method is characterized in that at least one further lateral transistor having a diffused emitter and a diffused collector is provided in a further island of the integrated semiconductor device, the emitter of said transistor being formed simultaneously with that of the said second transistor and the collector being formed simultaneously with the base of the said first transistor. The base of the said transistor is constituted by a further island itself.

In this manner three different types of transistors can be obtained in a monolithic semiconductor device. The way of providing the further transistor and the advantages thereof are described in greater detail in the patent application, Ser. No. 703,024, filed simultaneously with this application.

The emitters of the second and further transistor may have a strong impurity concentration and more particularly an impurity concentration which is much stronger than that of the collector of the further transistor.

The invention further relates to a semiconductor device manufactured by using a method according to the invention.

Figure 1B:
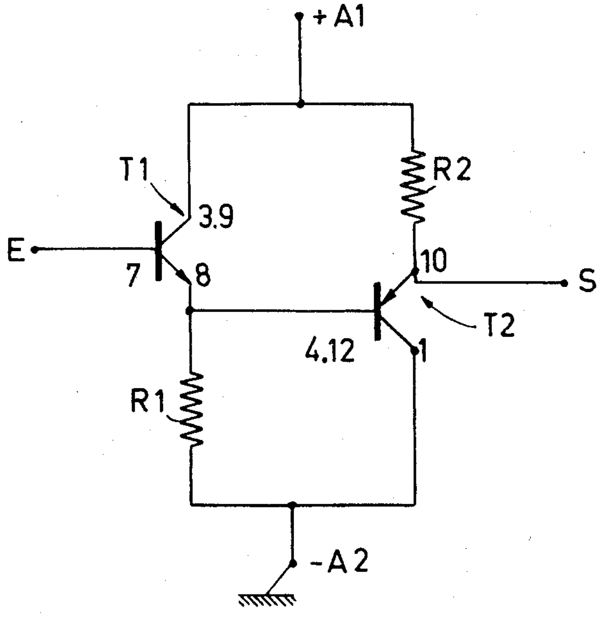

In order that the invention may be readily carried into effect, it will not be described in greater detail, by way of example, with reference to the accompanying drawings, in which:

FIG. 1*a* diagrammatically shows an integrated semiconductor device according to the invention, FIG. 1*b* shows a circuit diagram of the integrated semiconductor device shown in FIG. 1*a*.

FIGS. 2*a* to 2*g* show various stages in the manufacture of the device shown in FIG. 1*a*.

FIGS. 3*a* to 3*e* show various stages in the manufacture of a variation of the device according to the invention.

The integrated semiconductor device shown in FIG. 1*a* comprises a substrate 1 and islands 3 and 4 which are separated by isolating diffusions 5*a*, 5*b* and 6*c* and are insulated from the substrate by junctions 6*a* and 6*b*.

The figure shows a substrate 1 of the p-type and islands of the n-type. It is obvious that the invention is not restricted to this conductivity type. The conductivity types may be reversed in which the conductivity types of the subsequent diffusions have to be varied accordingly.

The island 3 comprises regions 7 and 8 which constitute the base and emitter of a vertical transistor T1 having a diffused base and emitter, the mass of the island 3 constituting the collector of said transistor. A collector contact 9 is formed in the material of the island 3.

The island 4 comprises a region 10 which constitutes the emitter of a vertical transistor T2, having a diffused single emitter, the diffusion from 11*a* of which is located at a small distance *h* from the junction 6*b*, and a base contact 12. The transistor T2 having a diffused single emitter is constituted by the emitter region 10 which is bounded by the junction 11, the base region 4 and the substrate 1 comprising the collector region. A base contact 12 is formed in the island 4.

FIG. 1*b* shows a known circuit diagram of a monolithic semiconductor circuit with complementary transistors, said circuit being destined for adaptation of impedances and preferably being manufactured with an integrated semiconductor device having complementary transistors T1 and T2 according to the invention.

The input for the signals is located at the point E on the base 7 of the npn-transistor T1 having a diffused base and emitter 8 and the output is arranged at the point S on the emitter 10 of the transistor T2 having a diffused single emitter. The collectors of the transistors T1 and T2 are denoted by 3 and 1, respectively.

The supply occurs between a point A1 which has positive potential and a point A2 which has negative potential and is connected to earth.

Resistors R1 and R2 ensure the required polarisations. They may be diffused in known manner in a monolithic assembly during the manufacture thereof.

It is to be noted that in this circuit the voltage which is applied between the collector 3 of the transistor T1 constituted by the mass of an island, and the collector 1 of a transistor T2 constituted by the substrate is such that the junction 6*a* is polarized in the reverse direction as a result of which the said junction constitutes a sufficient insulation between the two transistors T1 and T2.

The advantages of the use of the integrated semiconductor device according to the invention are considerable in this circuit arrangement. Actually, this circuit arrangement operates correctly only if the npn-transistor and the pnp-transistor have a gain of the same order. So it does not operate with a lateral transistor T2 having a diffused emitter and collector. With the transistor T2 having a diffused single emitter according to the invention, said device can thus be manufactured in an integrated form.

Figure 2A:
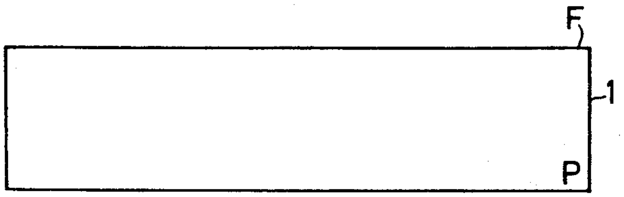
Figure 2B:
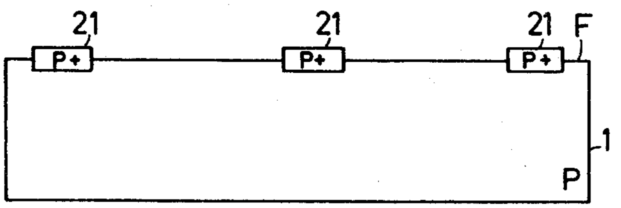
Figure 2C:
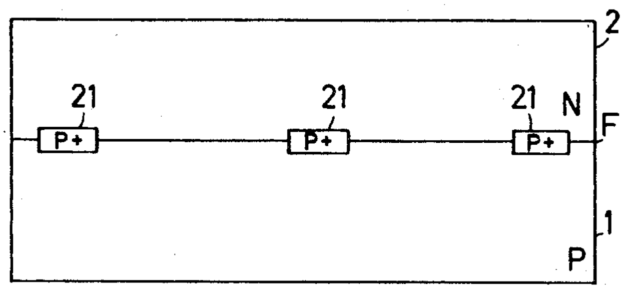

FIGS. 2*a* to 2*g* show various stages in the manufacture according to the invention in which the substrate 1, for example, of the p-conductivity type, is shown in FIG. 2*a*.

On the surface F of this substrate (see FIG. 2*b*) deposits 21 are provided of a doping material which is destined to constitute the isolation regions of a conductivity type which is equal to that of the substrate but with a high doping content.

Figure 2D:
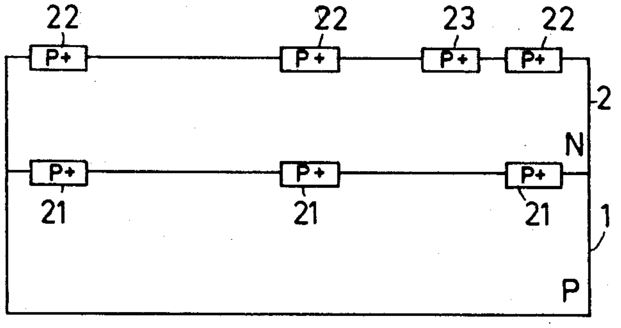

An epitaxial layer 2 of a conductivity type opposite to that of the substrate is then provided on the surface F and the deposits 21, on which layer of high resistance new deposits 22 and 23 which are shown in FIG. 2*d* are provided and which are formed of the same doping element and in an analogous concentration as that of the deposits 21. The deposits 22 which are provided opposite to the deposits 21 are destined to form, together with the latter, the isolation regions between the islands, while the deposit 23 is destined to constitute the emitter 10 of the transistor having a diffused single emitter.

Figure 2E:
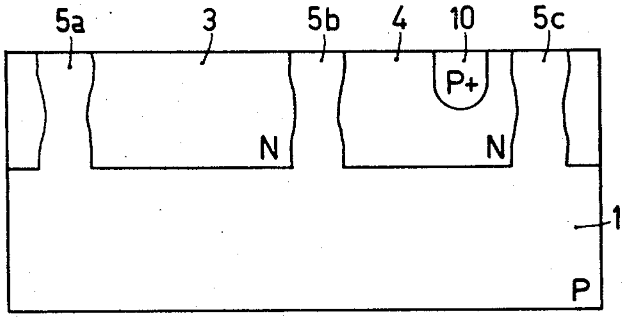
Figure 2F:
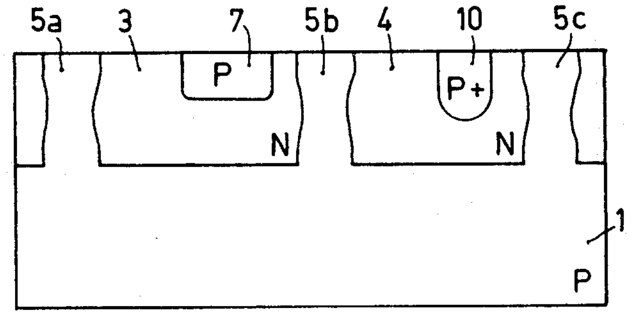

During a first diffusion treatment, which is shown in FIG. 2*e*, the insulation regions 5*a*, 5*b*, 5*c* having a high doping content are formed from the oppositely located deposits 21 and 22 in the epitaxial layer, a number of islands 3 and 4 being formed.

Simultaneously a region 10 having a strong doping is formed from the deposit 23.

By means of a second diffusion treatment the region 7 (FIG. 2*f*) is obtained of the same conductivity type as the regions 5*a*, 5*b*, 5*c* and 10 which are already formed but with a less high impurity content. This region 7 constitutes the base of the transistor T1 having a diffused emitter and base.

Figure 2G:
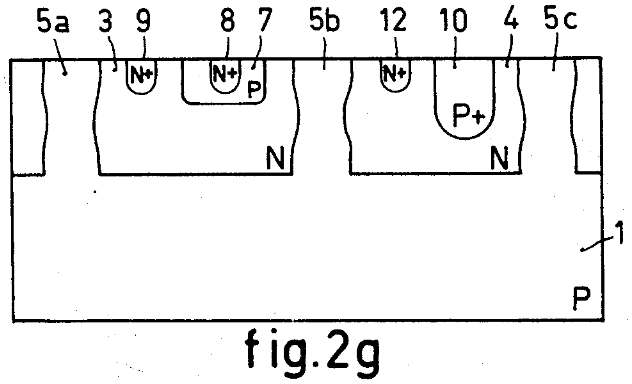

During a third diffusion treatment, the regions 8, 9 and 12 of FIG. 2*g* are formed of the same conductivity type as that of the epitaxial layer but with a high impurity concentration. The region 8 is destined to form the emitter of the transistor T1 having a diffused base and emitter. The regions 9 and 12 of the same conductivity type as the regions 3 and 4 but with a higher doping content form the collector contacts of the transistor T1 having a diffused base and emitter and the base contact of the transistor T2 having a diffused single emitter, respectively.

The diffusion treatments are carried out in a conventional manner by means of a masking silicon oxide layer.

Finally, apertures are provided in known manner in the oxide layer (not shown for clarity) for the contacts which are obtained by metallisation.

By way of example the manufacture of a monolithic semiconductor device will now be described having three transistors, an npn-transistor T'1 having a diffused base and emitter, and two pnp-transistors, one T'3, having a diffused emitter and collector, the other, T'2, having a diffused single emitter (see FIG. 3*e*).

Figure 3A:
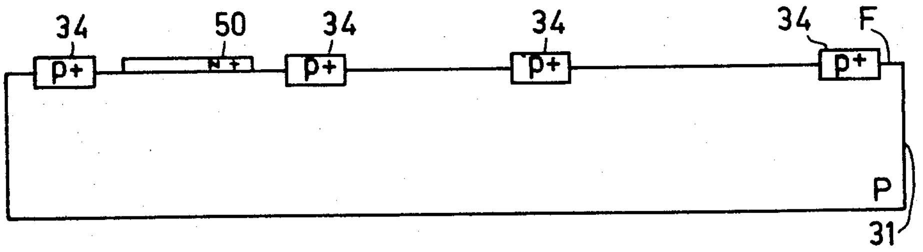

The starting material is a silicon wafer which is denoted by 31 in FIG. 3*a*; this wafer is a monocrystalline substrate of the p-type having a resistivity of, for example, 10 ohm cm. and a thickness of approximately 100 microns.

At the surface F an n-type arsenic deposit 50 is formed at a temperature of approximately 1100° C. and with a large surface concentration. This concentration is approximately $10^{21}$ at/cm.$^3$. This deposit 50 is destined to constitute in a conventional manner a "buried" layer in the collector of the transistor T'1 so as to reduce the collector series resistance.

Furthermore, p-type boron deposits 34 with a large surface concentration are provided in a conventional manner by prediffusion on the surface F at a temperature of approximately 1000° C. This concentration is approximately $10^{20}$ at/cm.$^3$.

Figure 3B:
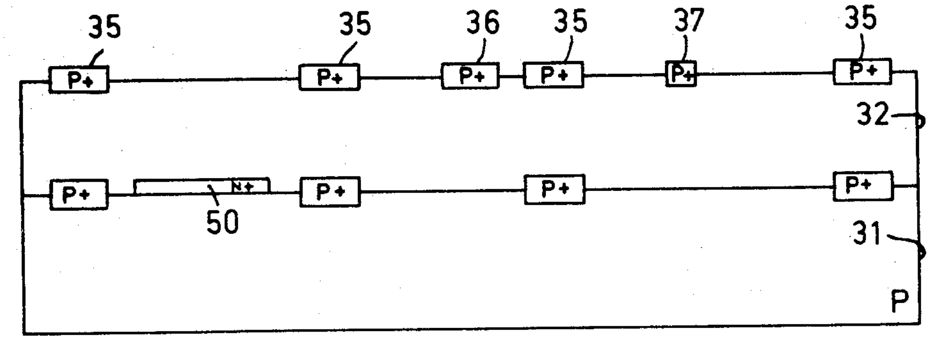

An epitaxial layer 32 of the n-type having a thickness of 10 micron and a resitivity of 0.5 ohm cm. is provided in known manner on the surface F of the substrate 31 at a temperature of approximately 1200° C. On this layer 32 boron deposits 35 are provided opposite to the deposits 34 in the same manner as these latter. Simultaneously the deposits 36 and 37 are provided which are destined to constitute the emitters of the transistors T'2 and T'3. These deposits 35, 36, 37 which are strongly p+ doped are shown in FIG. 3*b*.

Figure 3C:
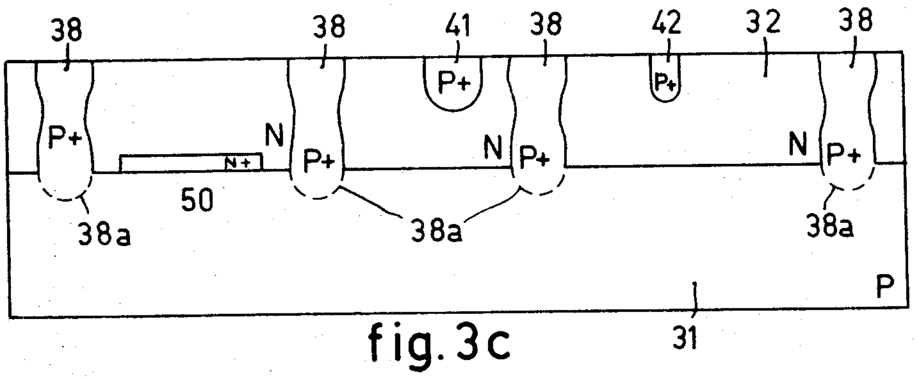
Figure 3D:
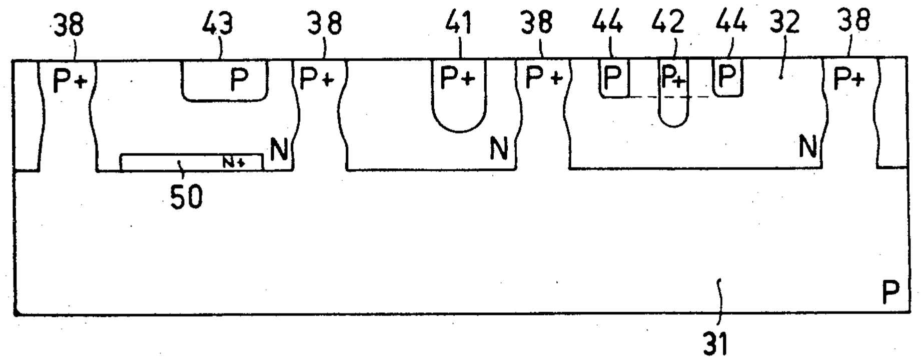
Figure 3E:
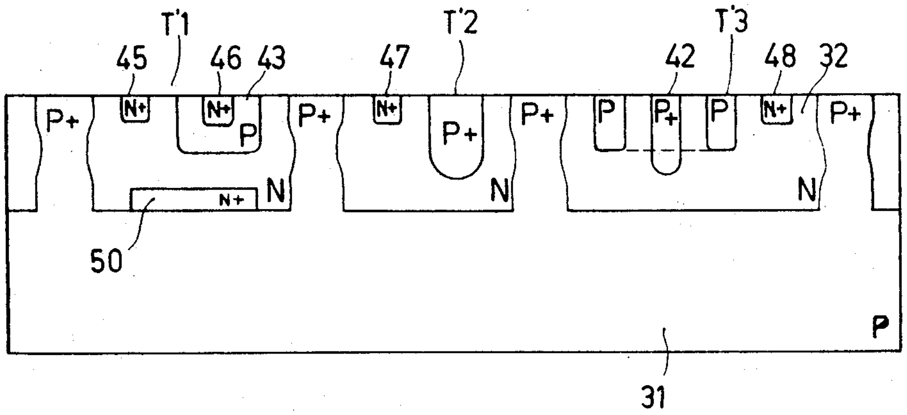

A first boron diffusion treatment at a temperature of 1200° C. in a neutral atmosphere, is then carried out; the deposits 34 and 35 are combined by diffusion and constitute the isolation regions 38 as shown in FIG. 3*c* while the deposits 36 and 37 constitute the regions 41 and 42 which constitute the emitters of the transistors T'2 and T'3. The regions 38, 41 and 42 are strongly p+ doped. The regions 38 have diffusion fronts 38*a* in the substrate 31. These diffusion fronts are not shown in the following figures for they constitute no pn-junctions.

Arsenic diffuses more slowly than boron so that the buried layer 50 remains comparatively thin.

Boron deposits are then formed in a conventional manner at a temperature of 900° C., which are not shown in the figure for clearness' sake. The boron concentration is approximately $10^{18}$ at/cm.$^3$. The regions 43 (base of the transistor T'1) and 44 (collector of the transistor T'3) are obtained from these deposits by diffusion at 1200° C. These regions are of the p-type and much more weakly doped than the regions 38, 41 and 42. It is to be noted that the region 44 surrounds the region 42.

Finally, the n+ regions 45 46 47 and 48 are formed in the conventional manner which constitute the base contact of the transistor T'1, the emitter of the transistor T'1, the base contact of the transistor T'2, and the base contact of the transistor T'3, respectively.

All the diffusion treatments are carried out in a conventional manner by means of a masking silicon oxide layer, not shown for clarity. Metal contacts can be connected to the transistors in a conventional manner through apertures in the oxide layer.

Of course, many variations are possible without departing from the scope of the invention.

What is claimed is:

1. A method of manufacturing an integrated semiconductor device comprising first and second isolated complementary transistors, comprising epitaxially growing a semiconductor layer of one conductivity type on a semiconductor substrate of the opposite conductivity type, diffusing into the epitaxial layer impurities of the opposite conductivity-forming type to form isolation regions of the opposite conductivity type extending entirely through the epitaxial layer defining therein plural islands of the one conductivity type, one of said islands to contain a first transistor and another of said islands to contain a second complementary transistor, simultaneously with the isolation diffusion step diffusing into said other island impurities of the opposite conductivity-forming type to form therein a diffused emitter region extending only partially within the epitaxial layer of the second transistor which emitter is spaced from the substrate by a portion of the said other island constituting a base region of the second transistor, the said substrate of opposite conductivity type constituting a collector region of the second transistor, thereafter diffusing into said one island impurities of said opposite conductivity-forming type to form therein a diffused base region of the opposite conductivity type of the first transistor and diffusing into said one island impurities of said one conductivity-forming type to form in said diffused base region a diffused emitter region of said one conductivity type of the first transistor, a portion of said one island between the diffused base and the substrate constituting a collector region of said first transistor, and making connections to the emitter, base and collector regions of the first and second transistors.

2. A method as set forth in claim 1 wherein strongly doped first deposits of opposite type impurities are provided on the substrate at locations to form the isolation regions, thereafter the epitaxial layer is grown on the substrate surface, thereafter strongly doped second deposits of opposite type impurities are provided on the epitaxial layer surface, some of the second deposits being located over the first deposits to form the isolation regions, at least one of the second deposits being located over the second island to be defined to form the emitter of the second transistor, and thereafter the thus formed assembly is heated to a temperature causing diffusion of the deposited impurities.

3. A method as set forth in claim 2 wherein the strongly doped deposits are made by prediffusion of impurities at a high temperature.

4. A method as set forth in claim 1 wherein strongly-doped one conductivity type contact regions are formed by diffusions in the collector island region of the first transistor and the base island region of the second transistor, said contact regions being diffused simultaneously with the emitter regions of the first transistor.

5. A method as set forth in claim 1 wherein a further island is provided to contain a third lateral transistor, and emitter and collector regions of the third transistor are formed by diffusion in said further island, said diffused emitter and collector being spaced apart by a portion of the original further island constituting a base region of the third transistor, the emitter of the third transistor being diffused simultaneously with the emitter of said second transistor, the collector of said third transistor being diffused simultaneously with the base of the first transistor.

References Cited

UNITED STATES PATENTS

| | | | |
|---|---|---|---|
| 3,260,902 | 7/1966 | Porter | 148—175UX |
| 3,335,341 | 8/1967 | Lin | 317—235 |
| 3,379,584 | 4/1968 | Beam et al. | 148—175 |
| 3,412,460 | 11/1968 | Lin | 148—175 |
| 3,421,205 | 1/1969 | Pollock | 148—175 |
| 3,457,125 | 7/1969 | Kerr | 148—187 |
| 3,460,006 | 8/1969 | Strull | 148—175X |

ALLEN B. CURTIS, Primary Examiner

U.S. Cl. X.R.

148—187; 317—235

PO-1050
(5/69)

UNITED STATES PATENT OFFICE
CERTIFICATE OF CORRECTION

Patent No. 3,562,032 Dated February 9, 1971

Inventor(s) JEAN-CLAUDE FROUIN and MECHEL DE BREBISSON

It is certified that error appears in the above-identified patent and that said Letters Patent are hereby corrected as shown below:

Column 1, line 28, "taype" should read -- type --;

line 37, "insulation" should read -- isolation

Column 2, line 28, after "having" insert -- a --;

line 30, "grain" should read -- gain --;

Column 3, line 13, "not" should read -- now --;

line 26, "6c" should read -- 5c --.

Column 5, line 32, "47" should read -- 17 --.

Signed and sealed this 8th day of June 1971.

(SEAL)
Attest:

EDWARD M.FLETCHER,JR.
Attesting Officer

WILLIAM E. SCHUYL
Commissioner of P